United States Patent
Diehl et al.

(10) Patent No.: US 9,746,678 B2
(45) Date of Patent: Aug. 29, 2017

(54) LIGHT WAVE SEPARATION LATTICES AND METHODS OF FORMING LIGHT WAVE SEPARATION LATTICES

(71) Applicant: APPLIED MATERIALS, INC., Santa Clara, CA (US)

(72) Inventors: Daniel Lee Diehl, Chiba (JP); Yong Cao, San Jose, CA (US); Mingwei Zhu, Sunnyvale, CA (US); Tai-Chou Papo Chen, Danvers, MA (US)

(73) Assignee: APPLIED MATERIALS, Santa Clara, CA (US)

( * ) Notice: Subject to any disclaimer, the term of this patent is extended or adjusted under 35 U.S.C. 154(b) by 76 days.

(21) Appl. No.: 14/291,712

(22) Filed: May 30, 2014

(65) Prior Publication Data
US 2015/0293363 A1    Oct. 15, 2015

Related U.S. Application Data

(60) Provisional application No. 61/978,803, filed on Apr. 11, 2014.

(51) Int. Cl.
*C23C 14/34* (2006.01)
*G02B 27/10* (2006.01)
(Continued)

(52) U.S. Cl.
CPC ...... *G02B 27/1013* (2013.01); *C23C 14/0676* (2013.01); *G02B 5/285* (2013.01)

(58) Field of Classification Search
CPC .. C23C 14/0676; G02B 27/1013; G02B 5/285
(Continued)

(56) References Cited

U.S. PATENT DOCUMENTS 5,411,794 A * 5/1995 Kawaguchi ......... C03C 17/3435
428/216
5,620,578 A * 4/1997 Hurwitt ................ C23C 14/564
118/719

(Continued)

OTHER PUBLICATIONS

Balaceanu et al. "Structural, mechanical and corrosion properties of TiOxNy/ZrOxNy multilayer coatings", Surface & Coatings Technology 202 (2008) 2384-2388.*
(Continued)

*Primary Examiner* — Rodney McDonald
(74) *Attorney, Agent, or Firm* — Moser Taboada; Alan Taboada (57) ABSTRACT

Light wave separation lattices and methods of formation are provided herein. In some embodiments, a light wave separation lattice includes a first layer having the formula $RO_xN_y$, wherein the first layer has a first refractive index; and a second layer, different from the first layer, disposed atop the first layer, and having the formula $R'O_xN_y$, wherein the second layer has a second refractive index different from the first refractive index, and wherein R and R' are each one of a metal or a dielectric material. In some embodiments, a method of forming a light wave separation lattice includes depositing a first layer having a predetermined desired refractive index atop a substrate by a physical vapor deposition process; and depositing a second layer, different from the first layer, atop the first layer, wherein the second layer has a predetermined second refractive index different from the first refractive index.

13 Claims, 5 Drawing Sheets

(51) Int. Cl.
*G02B 5/28* (2006.01)
*C23C 14/06* (2006.01)

(58) Field of Classification Search
USPC .......................... 204/192.26, 192.27, 192.28
See application file for complete search history.

(56) References Cited

U.S. PATENT DOCUMENTS

| | | | |
|---|---|---|---|
| 6,252,218 B1 * | 6/2001 | Chou | H01L 27/14603 250/208.1 |
| 8,330,840 B2 | 12/2012 | Lenchenkov | |
| 2001/0031365 A1 * | 10/2001 | Anderson | B32B 17/10036 428/432 |
| 2002/0033330 A1 * | 3/2002 | Demaray | C23C 14/345 204/192.26 |
| 2004/0166362 A1 | 8/2004 | Utsumi et al. | |
| 2007/0193982 A1 | 8/2007 | Brown et al. | |
| 2011/0037883 A1 | 2/2011 | Lee et al. | |
| 2012/0085944 A1 | 4/2012 | Gidon et al. | |
| 2012/0318664 A1 * | 12/2012 | Jiang | C23C 14/0676 204/192.1 |
| 2013/0032921 A1 | 2/2013 | Tai et al. | |
| 2013/0134415 A1 * | 5/2013 | Godo | H01L 29/66969 257/43 |

OTHER PUBLICATIONS

International Search Report and Written Opinion mailed Jun. 26, 2015 for PCT Application No. PCT/US2015/022119.
U.S. Appl. No. 14/269,010, filed May 2, 2014, Bencher et al.
Shinzo Koyama et al., "Day-and-Night Imager for Security Monitoring Cameras," Panasonic Technical Journal, vol. 54, No. 4, Jan. 2009.
Laurent Frey et al., "Color Filters Including Infrared Cut-Off Integrated on CMOS Image Sensor," Optics Express, vol. 19, No. 14, Jul. 4, 2011.
Mikio Hama et al., "CMOS Image Sensor with an Overlaid Organic Photoelectric Conversion Layer: Optical Advantages of Capturing Slanting Rays of Light," IISW, 2011.

* cited by examiner

LIGHT WAVE SEPARATION LATTICES AND METHODS OF FORMING LIGHT WAVE SEPARATION LATTICES

CROSS-REFERENCE TO RELATED APPLICATIONS

This application claims benefit of U.S. provisional patent application Ser. No. 61/978,803, filed Apr. 11, 2014, which is herein incorporated by reference in its entirety.

FIELD

Embodiments of the present disclosure generally relate to light wave separation lattices and methods of forming light wave separation lattices.

BACKGROUND

Color filters used in CMOS image sensors have typically been made from resist type materials and are capable of resolving red, green, blue, and white. The RGB pixels are arranged in patterns such as the Bayer pattern. The intensities of the light passing through the filters can approximate the true color of the light in a finite area (pixel) of an image, and by this means color images can be made electronically. The resist materials require a certain thickness in order to correctly resolve the color of the light. As pixels scale down in the XY direction there is a need for the structure on top of the photo diode, including the color filters, to scale down their thickness in the Z direction in order to minimize cross-talk and to improve quantum efficiency. However, color filter resists have reached their limits in scalability of thickness. Thus, new methods of creating color filters are being sought.

Accordingly, the inventors have developed improved light wave separation lattices and methods of forming light wave separation lattices.

SUMMARY

Light wave separation lattices and methods for forming light wave separation lattices are provided herein. In some embodiments, a light wave separation lattice includes a first layer having the formula $RO_XN_Y$, wherein the first layer has a first refractive index; and a second layer, different from the first layer, disposed atop the first layer, and having the formula $R'O_XN_Y$, wherein the second layer has a second refractive index different from the first refractive index.

In some embodiments, a method of forming a light wave separation lattice atop a substrate disposed in a physical vapor deposition (PVD) chamber includes (a) depositing a first layer having a formula $RO_XN_Y$, atop a substrate by a physical vapor deposition process, wherein the first layer has a predetermined first refractive index; and (b) depositing a second layer, different from the first layer and having a formula $R'O_XN_Y$, atop the first layer by a physical vapor deposition process, wherein the second layer has a predetermined second refractive index different from the first refractive index, and wherein R and R' are each one of a metal or a dielectric material.

In some embodiments, a method of forming a color filter includes (a) depositing a first layer having a predetermined first refractive index atop a substrate by a physical vapor deposition process, wherein the first layer has the formula $RO_XN_Y$; (b) depositing a second layer having the formula $R'O_XN_Y$ atop the first layer, wherein the second layer has a predetermined second refractive index different from the first refractive index; (c) repeating steps (a)-(b) to form a stack having a plurality of alternating first and second layers; (d) etching one of the first layer or the second layer to a first thickness at a first portion of the stack, to a second thickness at a second portion of the stack and to a third thickness at a third portion of the stack, wherein the first thickness is less than the second thickness and the second thickness is less than the third thickness; and (e) repeating steps (a)-(b).

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Improved light wave separation lattices and methods of forming light wave separation lattices are disclosed herein. In some embodiments, the light wave separation lattices formed herein may be used on different device structures, including, for example, a color filter, such as may be used on a complementary metal oxide semiconductor (CMOS) image sensor. In some embodiments, the light wave separation lattices described herein may advantageously be formed using methods that reduce the number of steps needed to form the lattices, resulting in improved product throughput. In some embodiments, the inventive methods of forming the light wave separation lattices may advantageously facilitate manufacture of light wave separation lattices with increased process throughput due to a reduced number of process steps. In some embodiments, the inventive methods may advantageously reduce contamination concerns and may allow for more precise tuning of lattice properties, for example refractive index values. Other benefits may also be realized via the methods and structures disclosed herein.

Figure 1:
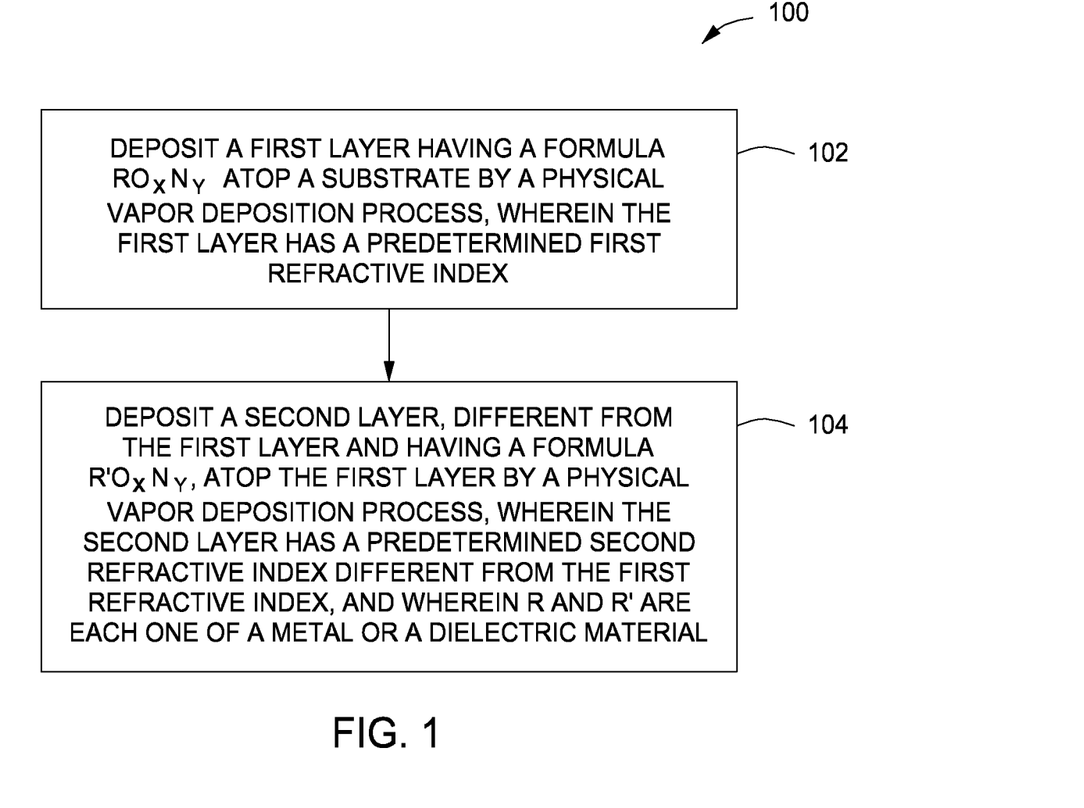
FIG. 1 depicts a flow chart for a method of forming light wave separation lattices in accordance with some embodiments of the present disclosure.

FIG. 1 depicts a method 100 for forming a light wave separation lattice in accordance with some embodiments of the present disclosure. The method is described below in accordance with the stages of fabrication of a light wave separation lattice depicted in FIGS. 2A-E.

Figure 4:
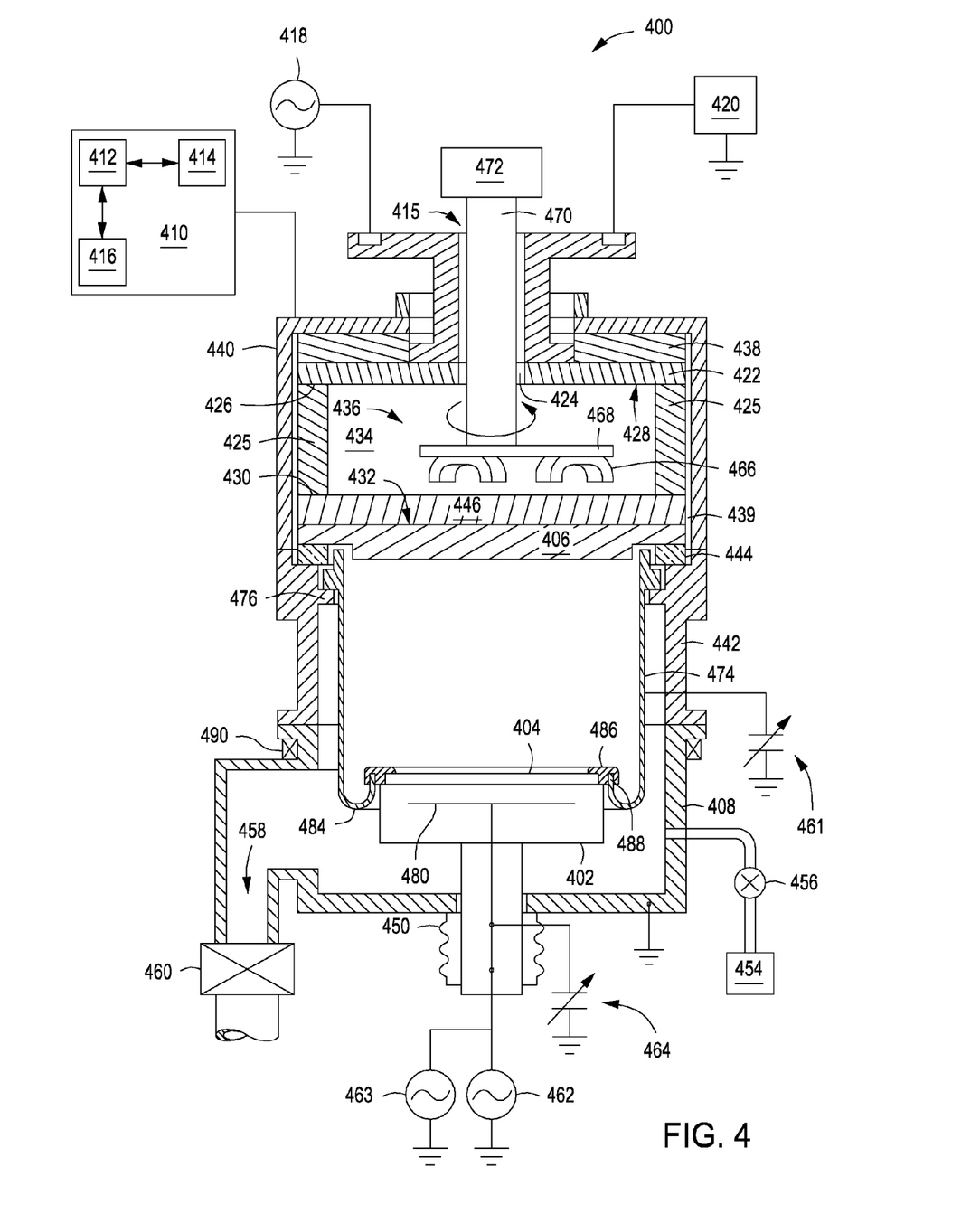
FIG. 4 depicts a schematic, cross-sectional view of a physical vapor deposition (PVD) chamber in accordance with some embodiments of the present disclosure.

In some embodiments, the method 100 may be performed in a physical vapor deposition (PVD) chamber, for example the PVD chamber described in FIG. 4. FIG. 4 depicts a schematic, cross-sectional view of a physical vapor deposition chamber (process chamber 400) in accordance with some embodiments of the present disclosure. Examples of PVD chambers suitable for performing the method 100 described herein include the ALPS® Plus and SIP ENCORE® PVD and Impulse™ PVD processing chambers, all commercially available from Applied Materials, Inc., of Santa Clara, Calif. Exemplary processing systems that may be used to perform the inventive methods disclosed herein may include the ENDURA® line of processing systems, commercially available from Applied Materials, Inc., of Santa Clara, Calif. Other process chambers, including those from other manufacturers, may also be suitably used in connection with the teachings provided herein.

Figure 2A:
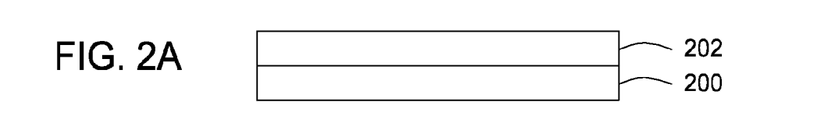
FIGS. 2A-E depicts the stages of fabrication of a light wave separation lattices in accordance with some embodiments of the present disclosure.
Figure 2B:
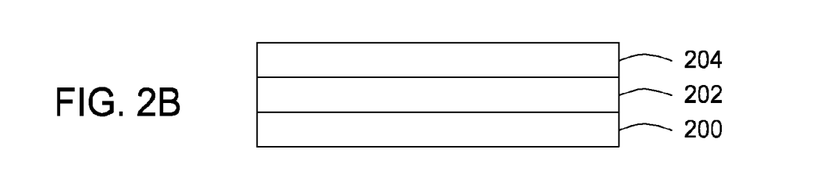

The method 100 begins at 102 where, as depicted in FIG. 2A, a first layer 202 having a predetermined desired refractive index is deposited atop a substrate 200 by a physical vapor deposition process. Next, at 104, and as depicted in FIG. 2B, a second layer 204 is deposited atop the first layer 202, wherein the second layer 204 has a predetermined second refractive index different from the first refractive index.

The substrate 200 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer (e.g., a 200 mm, 300 mm, or the like silicon wafer), such as a doped or undoped polysilicon wafer, a doped or undoped silicon wafer, a patterned or non-patterned wafer, or the like.

In some embodiments, the substrate 200 may be a partially formed image pixel having for example, a photodiode formed atop a silicon substrate, and interconnect layers formed atop the photodiode and used to route signals to CMOS transistors, and additional layers, such as insulation layers formed atop the photodiode and used to insulate the transistors from contamination.

In some embodiments, the first layer 202 may have the formula $RO_XN_Y$, where x and y can vary in concentration from 0% to 100%. In some embodiments, the second layer 204 may have the formula $R'O_XN_Y$, where x and y can vary in concentration from 0% to 100%. In some embodiments, R and R' may be a metal or a dielectric material, for example silicon (Si), titanium (Ti), aluminum (Al), hafnium (Hf), niobium (Nb), tantalum (Ta), tungsten (W), zirconium (Zr), or copper (Cu). In some embodiments, the first layer 202 may include carbon and/or hydrogen, resulting in the formula $RO_XN_YC_Z:H_W$, wherein w, x, y, and z can vary in concentration from 0% to 100%. Similarly, in some embodiments, the second layer 204 may include carbon and/or hydrogen, resulting in the formula $R'O_XN_YC_Z:H_W$, wherein w, x, y, and z can vary in concentration from 0% to 100%. The first layer 202 and the second layer 204 are different, for example by containing different percentages of materials resulting in different refractive indices. In some embodiments, R and R' are the same material. For example, in some embodiments, the first layer 202 may be one of $SiO_XN_Y$, $AlO_X$, AlN, $NiO_X$, $TiO_X$ and the second layer 204 may be another one of $SiO_XN_Y$, $AlO_X$, AlN, $NiO_X$, $TiO_X$. In some embodiments, the first layer 202 and second layer 204 may each have a thickness of about 10 nm to about 120 nm.

In some embodiments, the first layer 202 and second layer 204 are deposited by a physical vapor deposition process in a suitable process chamber, such as the process chamber 400 described below with respect to FIG. 4. The process chamber 400 may have a target (e.g. target 406) disposed therein that comprises a source material to be deposited atop the substrate 200. For example, in some embodiments the target 406 may comprise a metal or a dielectric material, for example silicon (Si), titanium (Ti), aluminum (Al), hafnium (Hf), niobium (Nb), tantalum (Ta), tungsten (W), zirconium (Zr), or copper (Cu).

In some embodiments, depositing the first layer 202 may include providing a process gas to the process chamber to react with material from the target 406. In some embodiments, depositing the second layer 204 may also include providing a process gas to the process chamber to react with material from the target 406. In some embodiments, the process gas may comprise one or more of an oxygen-containing gas, a nitrogen-containing gas, a carbon-containing gas, or a hydrogen containing gas. For example, in some embodiments, the process gas may comprise one or more of $O_2$, $O_3$, $N_2$, $NH_3$, $H_2$, CO, $CO_2$, or $CH_4$ or combinations thereof. The reaction causes the target to form a thin layer of a compound of the target material and the reactive gases on the target surface, which is then sputtered from the target surface and directed towards the substrate 200.

In some embodiments, the process gas may also comprise an inert gas, such as argon (Ar), helium (He), krypton (Kr), neon (Ne), xenon (Xe), or the like. The process gas may be provided at any suitable flow rate to sputter material from the target. For example, the process gas may be provided at a flow rate of between about 1 sccm to about 500 sccm. In some embodiments, a plasma may be formed from the process gas to facilitate sputtering the material from the target. In such embodiments, any suitable amount of power, such as at least one of DC or pulsed DC or RF power, may be applied to the target to ignite the process gas and maintain a plasma. For example, about 50 Watts to about 50,000 Watts of DC or RF power may be applied to the target to ignite the process gas and maintain a plasma.

In some embodiments, multiple PVD process chambers may be coupled to a cluster tool, such as the ENDURA® line of processing systems, to facilitate increased process throughput by reducing the number of process steps required to manufacture a light wave separation lattices, reducing contamination concerns and allowing for more precise tuning of lattice properties, for example refractive index control. For example, in some embodiments, the first layer 202 and the second layer 204 may be deposited in a single PVD chamber utilizing the same target material and a different process gas composition. For example, the first layer 202 may utilize a silicon target and a process gas comprising oxygen and argon, resulting in a first layer of silicon oxide while the second layer 204 may utilize a silicon target and a process gas comprising nitrogen and argon resulting in a second layer of silicon nitride.

In some embodiments, the first layer 202 and the second layer 204 may be deposited in different PVD chambers utilizing targets of the same material and different process gas composition (e.g. a first PVD chamber using a silicon target and a process gas comprising oxygen and argon and a second PVD chamber using a silicon target and a process gas comprising nitrogen and argon), or different target materials and different process gas compositions (e.g. a first PVD chamber using a silicon target and a process gas comprising oxygen and argon and a second PVD chamber using a titanium target and a process gas comprising nitrogen and argon), or different target material and the same process gas conditions (e.g. a first PVD chamber using a silicon target and a process gas comprising oxygen and argon and a second PVD chamber using a titanium target and a process gas comprising oxygen and argon).

In some embodiments, the first layer 202 may have a predetermined, desired first refractive index and the second layer 204 may have a predetermined, desired second refractive index, different from the first refractive index. The first refractive index and the second refractive index may be based on the deposition process parameters. For example, in some embodiments, the refractive index of the first layer and the second layer may be tuned to a desired value by controlling process parameters such as the composition of the process gas, the chamber pressure, and the chamber temperature. For example, in some embodiments, the process chamber may be maintained at a pressure of about 0.5 mTorr to about 300 mTorr. In addition, in some embodiments, the process chamber may be maintained at a temperature of about −20 degrees Celsius to about 500 degrees Celsius.

Figure 2C:
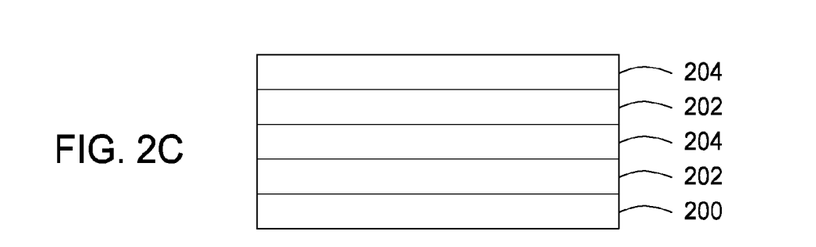
Figure 2D:
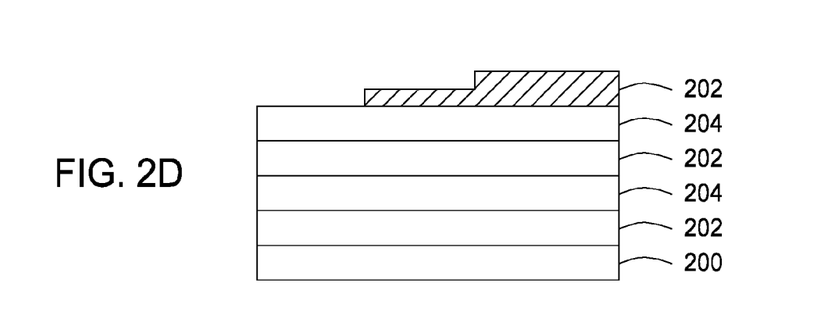
Figure 2E:
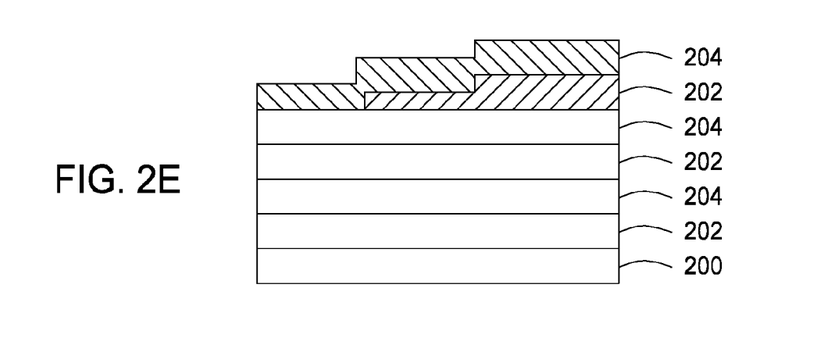

In some embodiments, steps 102 and 104 may be repeated to form a stack of alternating first and second layers as depicted in FIG. 2C. In some embodiments, one of the first layer 202 or the second layer 204 is etched to varying thicknesses across portions of the stack where each thickness discerns a different wavelength of light. The more thicknesses present in these layers, the more wavelengths can be resolved and the more information about the spectroscopic nature of the subject being photographed can be had. For example, in some embodiments, as depicted in FIG. 2D and FIG. 2E, one of the first layer 202 or the second layer 204 is etched to a first thickness at a first portion of the stack, to a second thickness at a second portion of the stack and to a third thickness at a third portion of the stack, wherein the first thickness is less than the second thickness and the second thickness is less than the third thickness. After etching, steps 102 and 104 may be repeated to form a light wave separation lattice to a desired thickness. In some embodiments, the step coverage of additional layers deposited after etching may be controlled by adjusting deposition parameters such as chamber pressure and substrate bias.

Figure 3:
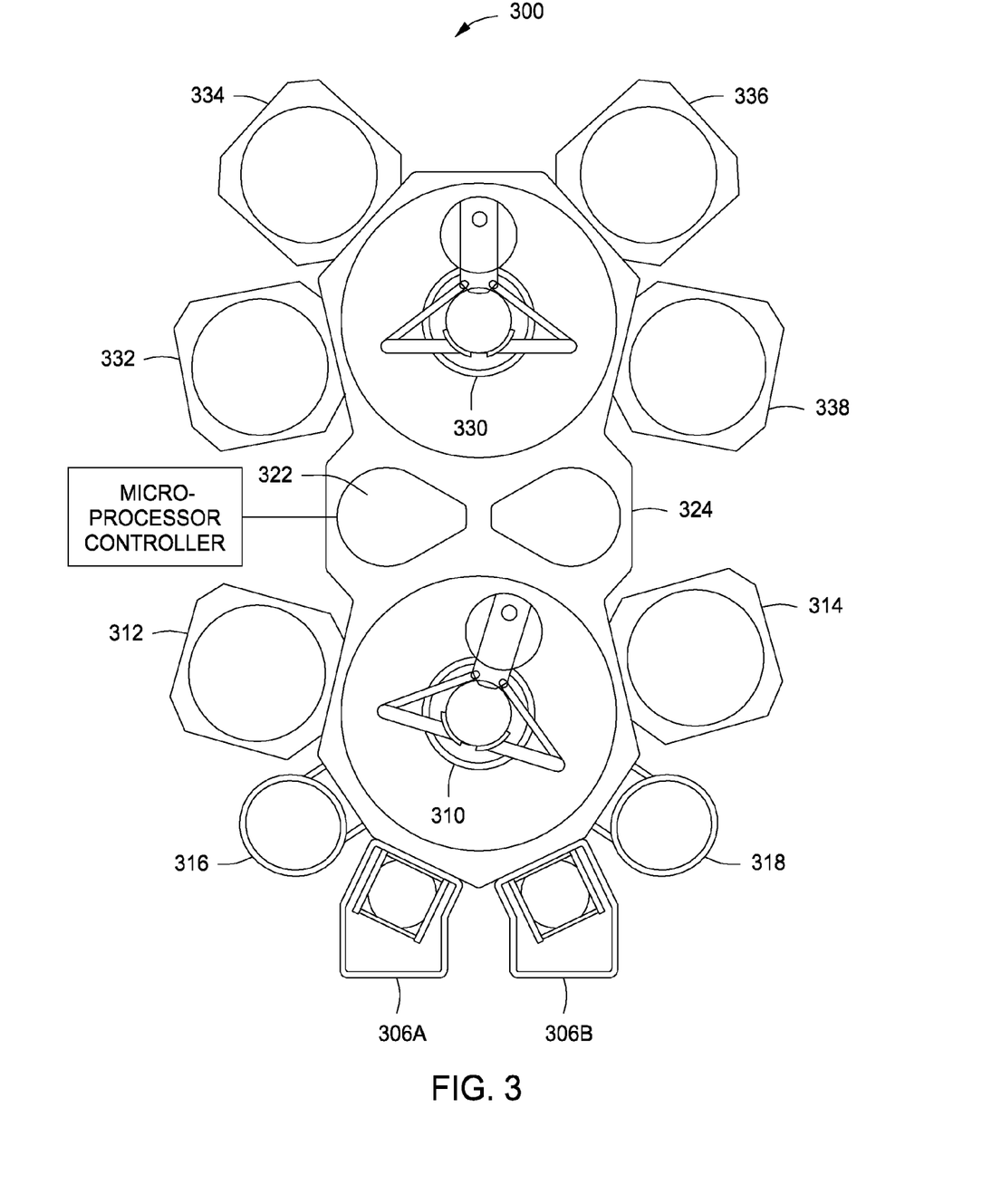
FIG. 3 depicts a cluster tool suitable for performing portions of the present disclosure in accordance with some embodiments of the present disclosure

The methods described herein may be performed in individual process chambers that may be provided in a standalone configuration or as part of a cluster tool, for example, an integrated tool 300 (i.e., cluster tool) described below with respect to FIG. 3. The cluster tool 300 features at least one physical vapor deposition (PVD) chamber 400, as described below. Examples of the integrated tool 300 include the ENDURA® integrated tool, available from Applied Materials, Inc., of Santa Clara, Calif. It is contemplated that the methods described herein may be practiced using other cluster tools having suitable process chambers coupled thereto, or in other suitable process chambers. For example, it may be advantageous in some embodiments, to perform the inventive methods discussed above in an integrated tool such that there are limited or no vacuum breaks between processing steps. For example, reduced vacuum breaks may limit or prevent contamination between layers or other portions of the substrate.

The cluster tool 300 can include one or more load lock chambers 306A, 306B for transferring of substrates into and out of the cluster tool 300. Typically, since the cluster tool 300 is under vacuum, the load lock chambers 306A, 306B may "pump down" the substrates introduced into the cluster tool 300. A first robot 310 may transfer the substrates between the load lock chambers 306A, 306B, and a first set of one or more substrate processing chambers 312, 314, 316, 318 (four are shown). Each processing chamber 312, 314, 316, 318, can be outfitted to perform a number of substrate processing operations including the physical vapor deposition processes described herein in addition to, atomic layer deposition (ALD), chemical vapor deposition (CVD), pre-clean, thermal process/degas, orientation and other substrate processes.

The first robot 310 can also transfer substrates to/from one or more intermediate transfer chambers 322, 324. The intermediate transfer chambers 322, 324 can be used to maintain ultrahigh vacuum conditions while allowing substrates to be transferred within the cluster tool 300. A second robot 330 can transfer the substrates between the intermediate transfer chambers 322, 324 and a second set of one or more processing chambers 332, 334, 336, 338. Similar to processing chambers 312, 314, 316, 318, the processing chambers 332, 334, 336, 338 can be outfitted to perform a variety of substrate processing operations including the physical vapor deposition processes described herein in addition to atomic layer deposition (ALD), chemical vapor deposition (CVD), pre-clean, thermal process/degas, and orientation, for example. Any of the substrate processing chambers 312, 314, 316, 318, 332, 334, 336, 338 may be removed from the cluster tool 300 if not necessary for a particular process to be performed by the cluster tool 300.

FIG. 4 depicts a schematic, cross-sectional view of a physical vapor deposition (PVD) process chamber (process chamber 400) suitable for performing at least portions of the above-described methods in accordance with some embodiments of the present disclosure. The process chamber 400 contains a substrate support 402 for receiving a substrate 404 thereon, and a sputtering source, such as a target 406. The substrate support 402 may be located within a grounded enclosure (e.g., chamber wall 408), which may be a chamber wall (as shown) or a grounded shield (a ground shield 440 is shown covering at least some portions of the process chamber 400 above the target 406. In some embodiments, the ground shield 440 could be extended below the target to enclose the substrate support 402 as well.).

In some embodiments, the process chamber includes a feed structure for coupling RF and/or DC energy to the target 406. A first end of the feed structure can be coupled to an RF power source 418 and/or to a DC or pulsed DC power source 420, which can be respectively utilized to provide RF and/or DC or pulsed DC energy to the target 406. In some embodiments, a plurality of RF power sources may be provided (i.e., two or more) to provide RF energy in a plurality of suitable frequencies.

In some embodiments, when sputtering a dielectric material, such as silicon, from the target 406, the surface will accumulate charges leading up to arcing and the ejection of particles from the arcing source or termination. The use of pulsed DC energy allows fast switching from negative, for sputtering, to positive, for sweeping or charge scrubbing, (neutralizing all the charges on the dielectric surface) of the target. The target 406 serves as the cathode of the plasma circuit during DC sputtering, and as the anode during charge scrubbing The second end of the feed structure may be coupled to a source distribution plate 422. The source distribution plate includes a hole 424 disposed through the source distribution plate 422 and aligned with a central opening of the feed structure. The source distribution plate 422 may be fabricated from suitable conductive materials to conduct the RF and DC energy from the feed structure.

The source distribution plate 422 may be coupled to the target 406 via a conductive member 425. The conductive member 425 may be a tubular member having a first end 426 coupled to a target-facing surface 428 of the source distribution plate 422 proximate the peripheral edge of the source distribution plate 422. The conductive member 425 further includes a second end 430 coupled to a source distribution plate-facing surface 432 of the target 406 (or to the backing plate 446 of the target 406) proximate the peripheral edge of the target 406.

A cavity 434 may be defined by the inner-facing walls of the conductive member 425, the target-facing surface 428 of the source distribution plate 422 and the source distribution plate-facing surface 432 of the target 406. The cavity 434 is coupled to the central opening 415 of the body via the hole 424 of the source distribution plate 422. The cavity 434 and the central opening 415 of the body may be utilized to at least partially house one or more portions of a rotatable magnetron assembly 436. In some embodiments, the cavity may be at least partially filled with a cooling fluid, such as water ($H_2O$) or the like.

A ground shield 440 may be provided to cover the outside surfaces of the lid of the process chamber 400. The ground shield 440 may be coupled to ground, for example, via the ground connection of the chamber body. The ground shield 440 has a central opening to allow the feed structure to pass through the ground shield 440 to be coupled to the source distribution plate 422. The ground shield 440 may comprise any suitable conductive material, such as aluminum, copper, or the like. An insulative gap 439 is provided between the ground shield 440 and the outer surfaces of the source distribution plate 422, the conductive member 425, and the target 406 (and/or backing plate 446) to prevent the RF and DC energy from being routed directly to ground. The insulative gap may be filled with air or some other suitable dielectric material, such as a ceramic, a plastic, or the like.

An isolator plate 438 may be disposed between the source distribution plate 422 and the ground shield 440 to prevent the RF and DC energy from being routed directly to ground. The isolator plate 438 has a central opening to allow the feed structure to pass through the isolator plate 438 and be coupled to the source distribution plate 422. The isolator plate 438 may comprise a suitable dielectric material, such as a ceramic, a plastic, or the like. Alternatively, an air gap may be provided in place of the isolator plate 438. In embodiments where an air gap is provided in place of the isolator plate, the ground shield 440 may be structurally sound enough to support any components resting upon the ground shield 440.

The target 406 may be supported on a grounded conductive aluminum adapter 442 through a dielectric isolator 444. The target 406 comprises a material to be deposited on the substrate 404 during sputtering, such as metal or metal oxide. In some embodiments, the backing plate 446 may be coupled to the source distribution plate-facing surface 432 of the target 406. The backing plate 446 may comprise a conductive material, such as copper-zinc, copper-chrome, copper molybdenum, or the same material as the target, such that RF and DC power can be coupled to the target 406 via the backing plate 446. Alternatively, the backing plate 446 may be non-conductive and may include conductive elements (not shown) such as electrical feedthroughs or the like for coupling the source distribution plate-facing surface 432 of the target 406 to the second end 430 of the conductive member 425. The backing plate 446 may be included for example, to improve structural stability of the target 406.

The substrate support 402 has a material-receiving surface facing the principal surface of the target 406 and supports the substrate 404 to be sputter coated in position opposite to the principal surface of the target 406. The substrate support 402 supports the substrate in an approximately planar position opposite the principal surface of the target 406. The substrate support 402 is configured to securely support the substrate in any curved or deformed position resultant from processing as disclosed herein. Different process chamber configurations, such as process chambers configured for chemical vapor deposition (CVD), thermal processing, or the like, may use similar or different configurations of thermal control systems to heat and/or cool the substrate during processing.

In some embodiments, the substrate support 402 may be vertically movable through a bellows 450 connected to a chamber wall 408 to allow the substrate 404 to be transferred onto the substrate support 402 through a load lock valve (not shown) in the lower portion of processing the process chamber 400 and thereafter raised to a deposition, or processing position. One or more processing gases may be supplied from a gas source 454 through a mass flow controller 456 into the lower part of the process chamber 400. An exhaust port 458 may be provided and coupled to a pump (not shown) via a valve 460 for exhausting the interior of the process chamber 400 and facilitating maintaining a desired pressure inside the process chamber 400.

An RF bias power source 462 may be coupled to the substrate support 402 in order to induce a negative DC bias on the substrate 404. In addition, in some embodiments, a negative DC self-bias may form on the substrate 404 during processing. Further, a second RF bias power source 463 may be coupled to the substrate support 402 and provide any of the frequencies discussed above for use with the RF bias power source 462. In other applications, the substrate support 402 may be grounded or left electrically floating. For example, a capacitance tuner 464 may be coupled to the substrate support pedestal for adjusting voltage on the substrate 404 for applications where RF bias power may not be desired.

In some embodiments, it is also desirable to apply a bias to the substrate 404 during different phases of the deposition process. Therefore, a bias may be provided to a bias electrode 480 in the substrate support 402 from a power source (e.g., RF bias power source 462), so that the substrate 404 will be bombarded with ions formed in the plasma during one or more phase of the deposition process. The bombardment process may be performed by forming a plasma over a surface of the substrate and then biasing the substrate, or substrate support that the substrate is resting on, so that ionized gas atoms in the plasma bombard the surface of the substrate. Biasing the electrode 480 can be used to adjust the smoothness of the surface of the substrate 404 and adjust the hydrophobicity for the surface of the substrate 404. In some process examples, the bias is applied to the substrate after the deposition process has been performed. Alternately, in some process examples, the bias is applied during the deposition process. Thus, when the substrate bias is maintained throughout the deposition process the bombarding atoms add kinetic energy to the depositing material found at the surface of the substrate. For example, between about 50

Watts and about 1100 Watts of energy may be used to bias ions to the substrate 404 to form a smooth dense film. A larger bias drives the ions with greater energy to the substrate surface. The stronger the bias of the ions to the substrate, the denser and smoother the surface of the deposited layer 202, 204 becomes. The bombardment process can be used to smooth the surface of the deposited layer 202, 204, so that the surface does not have significant roughness or macroscopic features, such as small bumps or divots.

A rotatable magnetron assembly 436 may be positioned proximate a back surface (e.g., source distribution plate-facing surface 432) of the target 406. The rotatable magnetron assembly 436 includes a plurality of magnets 466 supported by a base plate 468. The base plate 468 connects to a rotation shaft 470 coincident with the central axis of the process chamber 400 and the substrate 404 as illustrated in FIG. 4. A motor 472 can be coupled to the upper end of the rotation shaft 470 to drive rotation of the magnetron assembly 436. The magnets 466 produce a magnetic field within the process chamber 400, generally parallel and close to the surface of the target 406 to trap electrons and increase the local plasma density, which in turn increases the sputtering rate. The magnets 466 produce an electromagnetic field around the top of the process chamber 400, and magnets 466 are rotated to rotate the electromagnetic field which influences the plasma density of the process to more uniformly sputter the target 406.

In some embodiments, the process chamber 400 may further include a process kit shield 474 connected to a ledge 476 of the adapter 442. The adapter 442 in turn is sealed and grounded to the chamber wall 408. Generally, the process kit shield 474 extends downwardly along the walls of the adapter 442 and the chamber wall 408 downwardly to below an upper surface of the substrate support 402 and returns upwardly until reaching an upper surface of the substrate support 402 (e.g., forming a u-shaped portion 484 at the bottom). Alternatively, the bottommost portion of the process kit shield need not be a u-shaped portion 484 and may have any suitable shape. A cover ring 486 rests on the top of an upwardly extending lip 488 of the process kit shield 474 when the substrate support 402 is in its lower, loading position but rests on the outer periphery of the substrate support 402 when it is in its upper, deposition position to protect the substrate support 402 from sputter deposition. In some embodiments, a capacitance tuner 461 may be coupled to the process kit shield 474 for adjusting voltage on the process kit shield 474. The capacitance tuner 461 may be utilized, for example, to direct ion flow towards the process kit shield 474 and/or in combination with the capacitance tuner 464 to control the energy and direction of ion flow.

In some embodiments, a magnet 490 may be disposed about the process chamber 400 for selectively providing a magnetic field between the substrate support 402 and the target 406. For example, as shown in FIG. 4, the magnet 490 may be disposed about the outside of the chamber wall 408 in a region just above the substrate support 402 when in processing position. In some embodiments, the magnet 490 may be disposed additionally or alternatively in other locations, such as adjacent the adapter 442. The magnet 490 may be an electromagnet and may be coupled to a power source (not shown) for controlling the magnitude of the magnetic field generated by the electromagnet.

A controller 410 may be provided and coupled to various components of the process chamber 400 to control the operation thereof. The controller 410 includes a central processing unit (CPU) 412, a memory 414, and support circuits 416. The controller 410 may control the process chamber 400 directly, or via computers (or controllers) associated with particular process chamber and/or support system components. The controller 410 may be one of any form of general-purpose computer processor that can be used in an industrial setting for controlling various chambers and sub-processors. The memory, or computer readable medium, of the controller 410 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 416 are coupled to the CPU 412 for supporting the processor in a conventional manner. These circuits include cache, power supplies, clock circuits, input/output circuitry and subsystems, and the like. Inventive methods as described herein may be stored in the memory 414 as software routine that may be executed or invoked to control the operation of the process chamber 400 in the manner described herein. The software routine may also be stored and/or executed by a second CPU (not shown) that is remotely located from the hardware being controlled by the CPU 412.

Figure 5:
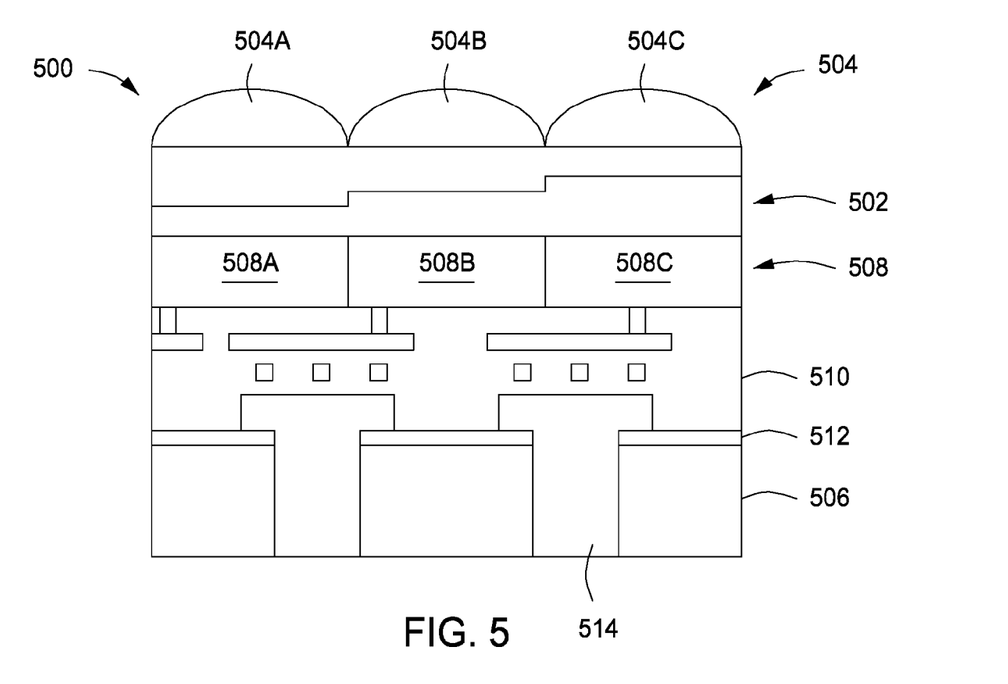
FIG. 5 depicts an exemplary color filter formed atop an exemplary CMOS image sensor in accordance with some embodiments of the present disclosure.

In some embodiments, the methods and apparatus described herein may be used in the formation of an image sensor. Conventional image sensors may be formed in two steps. For example, a first step where the image sensor is initially fabricated using conventional CMOS transistor fabrication techniques and a second step where the color filter is formed using the methods and apparatus disclosed above. FIG. 5 depicts an exemplary color filter 502 formed atop an exemplary back-side illuminated CMOS image sensor 500. The methods and apparatus described herein may also be used in the formation of a front-side illuminated CMOS image sensor. The exemplary image sensor 500 comprises a substrate 506 of a suitable material as described above, for example a silicon substrate. In some embodiments, a photodiode layer 508, to convert light into electrical signals, is fabricated in the silicon substrate 506. In some embodiments, the image sensor 500 further comprises interconnect layer 510 which routes signals from the photodiode layer 508. The image sensor 500 may further comprise suitable vias 514, formed from, for example, copper or tungsten, to contact the interconnect layer 510. In some embodiments, adjacent the interconnect layer 510 is a passivation layer 512, for example a silicon nitride layer, which insulates the interconnect layer 510 from external contamination. In some embodiments, a micro-lens layer 504 may be formed atop the color filter 502. The micro-lens layer 504 is used to concentrate incoming light onto the photodiode layer 508. In some embodiments, the micro-lens layer 504 may consist of individual micro-lenses 504A, 504B, 504C associated with a specific photodiode 508A, 508B, 508C.

In some embodiments, the micro-lens layer 504 and the color filter layer 502 may be a single layer. In some embodiments, after forming the color filter layer 502 as described above, the top surface of the color filter layer 502 may be directionally etched to provide a curved top surface suitable for use as a micro-lens. The etch process may be a plasma etch process suitable for etching layers having the formula $RO_XN_Y$ or $R'O_XN_Y$ or having the formula $RO_XN_YC_Z:H_W$ or $R'O_XN_YC_Z:H_W$, as described above. In some embodiments, the color filter layer 502 may be formed of materials that produce a curved surface when annealed.

While the foregoing is directed to embodiments of the present disclosure, other and further embodiments of the disclosure may be devised without departing from the basic scope thereof.

The invention claimed is:

1. A method of forming a light wave separation lattice atop a substrate disposed in a physical vapor deposition (PVD) chamber, comprising:
   (a) depositing a first layer having a formula $RO_XN_Y$, atop a substrate comprising a photodiode layer disposed atop an interconnect layer, by a physical vapor deposition process, wherein the first layer has a predetermined first refractive index; and
   (b) depositing a second layer, different from the first layer and having a formula $R'O_XN_Y$, atop the first layer by a physical vapor deposition process, wherein the second layer has a predetermined second refractive index different from the first refractive index, wherein R and R' are each one of a metal or a dielectric material, and wherein the first and second layers form a light wave separation lattice atop the photodiode layer.

2. The method of claim 1, wherein the first layer is deposited in a first physical vapor deposition process chamber and the second layer is deposited in a second physical vapor deposition process chamber and wherein the first physical vapor deposition process chamber and the second physical vapor deposition process chamber are coupled to a cluster tool.

3. The method of claim 2, wherein the first physical vapor deposition process chamber and second physical vapor deposition process chamber each comprise a target composed of one of silicon (Si), titanium (Ti), aluminum (Al), hafnium (Hf), niobium (Nb), tantalum (Ta), tungsten (W), zirconium (Zr), or copper (Cu).

4. The method of claim 1, wherein at least one of depositing the first layer or the second layer further comprises flowing a process gas into the chamber.

5. The method of claim 4, wherein the process gas comprises one or more of an oxygen-containing gas, a nitrogen-containing gas, a carbon-containing gas, or a hydrogen-containing gas.

6. The method of claim 1, further comprising
   repeating steps (a)-(b) to form a stack having a plurality of alternating first and second layers;
   etching one of the first layer or the second layer to a first thickness at a first portion of the stack, to a second thickness at a second portion of the stack and to a third thickness at a third portion of the stack, wherein the first thickness is less than the second thickness and the second thickness is less than the third thickness, and wherein each thickness filters a different wavelength of light; and
   repeating steps (a)-(b).

7. The method of claim 1, wherein each of the first layer and second layer has a thickness of about 10 nm to about 120 nm.

8. The method of claim 4, further comprising:
   generating a plasma over a surface of the substrate to ionize the process gas; and
   biasing an electrode coupled to a portion of the chamber to cause the ionized process gas to bombard the surface of the substrate.

9. The method of claim 8, wherein biasing the electrode is used to control at least one of smoothness or hydrophobicity of the surface of the substrate.

10. A method of forming a color filter, comprising:
    (a) depositing a first layer having a predetermined first refractive index atop a substrate by a physical vapor deposition process, wherein the first layer has the formula $RO_XN_Y$;
    (b) depositing a second layer having the formula $R'O_XN_Y$ atop the first layer, wherein the second layer has a predetermined second refractive index different from the first refractive index, wherein R and R' are each one of a metal or a dielectric material;
    (c) repeating steps (a)-(b) to form a stack having a plurality of alternating first and second layers;
    (d) etching one of the first layer or the second layer to a first thickness at a first portion of the stack, to a second thickness at a second portion of the stack and to a third thickness at a third portion of the stack, wherein the first thickness is less than the second thickness and the second thickness is less than the third thickness, wherein each thickness filters a different wavelength of light; and
    (e) repeating steps (a)-(b).

11. The method of claim 10, wherein R and R' are each one of silicon (Si), titanium (Ti), aluminum (Al), hafnium (Hf), niobium (Nb), tantalum (Ta), tungsten (W), zirconium (Zr), or copper (Cu).

12. The method of claim 10, wherein at least one of the first layer or the second layer further comprise at least one of carbon or hydrogen.

13. The method of claim 10, wherein the substrate further comprises a photodiode layer atop an interconnect layer, wherein the color filter is formed atop the photodiode layer.

* * * * *